United States Patent [19]

Threewitt

[11] Patent Number: 5,383,146
[45] Date of Patent: Jan. 17, 1995

[54] MEMORY WITH CAM AND RAM PARTITIONS

[75] Inventor: Norman B. Threewitt, Colorado Springs, Colo.

[73] Assignee: Music Semiconductors, Inc., Colorado Springs, Colo.

[21] Appl. No.: 894,259

[22] Filed: Jun. 8, 1992

[51] Int. Cl.⁶ .............................................. G06F 12/00
[52] U.S. Cl. ................................ 365/49; 364/DIG. 1; 395/425
[58] Field of Search ........................................ 365/49; 364/200 MS File, 900 MS File; 395/425

[56] References Cited

U.S. PATENT DOCUMENTS

| | | | |
|---|---|---|---|
| 3,257,646 | 6/1966 | Roth | 340/172.5 |
| 3,353,159 | 11/1967 | Lee | 340/172.5 |
| 3,675,211 | 7/1972 | Raviv | 340/172.5 |
| 3,685,020 | 8/1972 | Meade | 340/172.5 |
| 3,868,642 | 2/1975 | Sachs | 340/172.5 |
| 4,472,805 | 9/1984 | Wacyk et al. | 371/51.1 |
| 4,670,858 | 6/1987 | Almy | 365/49 |
| 4,747,080 | 5/1988 | Yamada | 365/200 |
| 4,845,668 | 7/1989 | Sano et al. | 365/49 |
| 4,903,234 | 2/1990 | Sakuraba et al. | 365/49 |
| 4,928,260 | 5/1990 | Chuang et al. | 365/49 |
| 4,958,377 | 9/1990 | Takahashi | 382/34 |
| 4,975,873 | 12/1990 | Nakabayashi et al. | 365/49 |
| 5,014,195 | 5/1991 | Farrell et al. | 364/200 |
| 5,036,486 | 7/1991 | Noguchi et al. | 365/49 |
| 5,053,991 | 10/1991 | Burrows | 365/49 |
| 5,107,501 | 4/1992 | Zorian | 365/49 |
| 5,111,427 | 5/1992 | Kobayashi et al. | 365/49 |
| 5,226,005 | 7/1993 | Lee et al. | 365/49 |
| 5,265,100 | 11/1993 | McClure et al. | 371/21.2 |

Primary Examiner—Joseph L. Dixon
Assistant Examiner—Matthew Kim
Attorney, Agent, or Firm—Linda Flewellen Gould

[57] ABSTRACT

A method is described of programming a memory array on a single integrated circuit so that a portion of each data word is characterized as CAM, with the remaining portion of each data word functioning as RAM. The programmable memory array is partitioned into CAM and RAM subfields by disabling the comparators in each memory cell in selected columns of CAM cells to create RAM-functioning cells. Said partitioning may be re-programmed to enable the comparators in said RAM-functioning cells to be re-enabled, so that said cells may participate in subsequent comparisons to a search word. The described memory array permits direct retrieval and storage of associated information in RAM-functioning cells corresponding to data words which are determined to match a given search word. This direct retrieval and storage process can efficiently be utilized without computing or decoding an address for the associated information.

10 Claims, 3 Drawing Sheets

MEMORY WITH CAM AND RAM PARTITIONS

BACKGROUND OF THE INVENTION

1. Technical Field

This invention pertains to a memory which can be partitioned into random access memory (RAM) and content addressable memory (CAM) subfields, all on the same integrated circuit.

2. Background Art

A content addressable memory is a memory device in which data is stored in word locations comprising multiple memory cells, each cell storing a single bit of information. Unlike random access memory, a search word in a comparand register may be simultaneously compared with all stored data words. When a match occurs between the search word and one or more of the stored data words, a match signal is generated. If a comparison for only a portion of a stored data word is desired, one or more mask registers may be used to prevent particular bits within the data word or words from taking part in the comparison with the search word.

Various CAM devices are known in the prior art. For example, U.S. Pat. No. 4,845,668 to Sano et al. teaches a variable field CAM. Each stored data word can be divided into fields so that only one or more fields comprising a portion of the stored data word are compared with a corresponding segment of a search word.

U.S. Pat. No. 3,353,159 to Lee describes a CAM in which a search word is compared to stored data words, followed by adding information concerning the location of matched words to the existing stored data words. A new search may then be conducted using new criteria, to search the memory array based on both initially stored information and information added in response to the first search.

A character identification device is described in U.S. Pat. No. 4,958,377 to Takahashi. This device utilizes CAM with a masking scheme to select what portion of each stored data word is searched. U.S. Pat. No. 3,257,646 to Roth reveals a CAM array wherein a multistep search process is utilized, to compare a portion of a search word against one field of stored data words, followed by a subsequent search of another portion of the search word compared against a different field of the same set of stored data words. In this manner, a data base with variable word lengths may be searched.

U.S. Pat. No. 3,675,211 to Raviv discloses a tertiary associative memory with a field for storing variable length codes, a field for storing corresponding fixed length codes, and a length field storing the number of significant bits in each of the variable length codes. The variable length code includes data associated with a corresponding fixed length code, but may be stored on a separate RAM chip.

U.S. Pat. No. 3,685,020 to Meade and U.S. Pat. No. 3,868,642 to Sachs both describe memory systems with CAM and RAM components. The Meade patent includes a random access array which is accessed through a CAM array. When a match is identified in the CAM portion, corresponding information in RAM is energized. Similarly, the Sachs patent describes a CAM array with a RAM portion for storing associated data. In both cases, the RAM and CAM cells are physically different, so that there is no ability to vary which portion of the memory system functions as RAM, and which as CAM.

RAM devices are also known in the prior art which can be subdivided or configured by variable lengths. For example, U.S. Pat. No. 5,014,195 to Farrell et al. discusses a set associative cache which can be selectively configured to provide different data sets arrangements. U.S. Pat. No. 4,903,234 to Sakuraba et al. discloses a memory system which can be subdivided according to key data setting units.

While each of these memory devices known in the prior art is useful for its intended purpose, no memory array is known which may be partitioned in a programmable fashion by the user into separate CAM and RAM sections. A need exists for a memory array which can be partitioned into separate CAM and RAM sections, with only the CAM section of each stored data word participating in comparisons, and with associated information directly retrievable from the RAM portion of each stored data word which is found to match when a comparison is conducted. Such a memory array can be used in a variety of applications, including optical and magnetic disk cache memories, data base systems, machine vision systems, and target acquisition systems. In one application, such a memory array may be beneficially used in local area network (LAN) bridges and routers to search a station list and retrieve associated information from a matched data word such as a bridge port address, segment status, access conditions, and station aging data.

DISCLOSURE OF THE INVENTION

Summary of the Invention

An object of this invention is to provide a method of programming a memory array on a single integrated circuit so that a portion of each data word is characterized as CAM, with the remaining portion of each data word functioning as RAM.

Another object of this invention is to provide a memory army which may be partitioned into CAM and RAM subfields, so that information associated with each data word may be stored in and directly retrieved from the RAM subfield of that data word, without having such associated information participate in CAM searches. Thus, the terms "associated information" and "associated data" shall be used herein to refer to information which is stored in a RAM subfield of a data word, so that such information does not participate in comparisons, but is associated with other information in the same data word which does participate in comparison.

Yet another object of this invention is to provide a memory array in which a RAM subfield may be subsequently re-programmed to function as CAM, so that associated information stored in said subfields may be searched in subsequent comparisons.

Yet another object of this invention is to provide a CAM array with RAM subfields, without interfering with bit masking.

The memory array used to achieve these objectives can store a predefined number N of data words, each word consisting of a predefined number M of bits. Each bit of information is stored in a RAM cell, which is connected to a comparator. Each comparator functions to compare the bit of information in its RAM cell to a corresponding bit in a comparand register. As is the case with any CAM array, corresponding bits in all N words are simultaneously compared to the applicable bit in the comparand register. Each RAM cell and the comparator attached to it comprise a single CAM cell, with the bits constituting each data word being stored in M memory cells.

The comparators for all corresponding bits in any bit column within the memory array can be disabled, so that all bits in that bit column do not participate in any comparison with the search word in the comparand register. Effectively, each bit column which has been so disabled then functions as RAM, rather than CAM. Disabling of a bit column may be accomplished by forcing the comparator in each memory cell in that bit column to send a match signal indicating a match regardless of whether an actual match exists. In this manner, a match signal will be generated for any data word in which all bits participating in the comparison do match the comparand, since a no-match signal indicating a failure to match cannot be sent from the bit columns whose comparators were disabled.

Associated information may be stored in those CAM cells in each data word which are functioning as RAM cells. The associated information to be stored may include a variety of different data, including addresses, port addresses, aging information, and entry type designators. The array may be designed so that associated information is directly stored in those CAM cells which are functioning as RAM cells for each data word which is determined to match the search word in the comparand register. This information storage means can efficiently add associated information to the appropriate RAM cells, without determining the address of those RAM cells.

The information storage means may be bi-directional, so that associated information may also be directly retrieved from CAM cells functioning as RAM cells in each data word. Such a direct storage and retrieval of associated information results in considerable savings of time over storage and retrieval of associated information involving memory locations outside of the CAM array, such as on another integrated circuit. Because associated information is stored in RAM portions of the CAM array, associated information is stored and retrieved in a simpler and much faster manner than in situations in which CAM and RAM are located on separate integrated circuits. Direct storage and retrieval also eliminates time consuming steps to compute and decode an address identifying the location of associated information to be retrieved or stored.

A programming means is provided by which those columns of CAM cells are chosen which will function as RAM cells. As a result, the user may choose and identify the portion of the memory array which is to function as RAM, tailoring that choice to the size of the data word needed for comparison to the search word, and providing sufficient RAM to store associated information related to each data word chosen in a search. The portion of the array so chosen can be changed as needed in the application by simply re-programming the CAM/RAM partitioning.

A write masking means may be provided, to selectively mask a portion of those CAM cells functioning as RAM. Such a masking means will prevent associated information from being stored in the masked portions of the RAM subfield, leaving those masked portions intact, allowing only the desired bits in the RAM subfield to be altered.

Bit masking schemes for CAM arrays are well known in the prior art. Such masking enables a particular sequence of bits to be identified which will not participate in comparisons with the search word. The sequence of bits to be excluded from comparisons is usually stored in a mask register between the comparand register and the memory array. Such bit masking techniques can be used in conjunction with the memory array claimed herein, without any interference between bit masking and the disabling of comparators in particular bit columns to form RAM subfields.

The novel features that are considered characteristic of the invention are set forth with particularity in the claims. The invention itself, both as to its construction and its method of operation, together with additional objects and advantages thereof, will best be understood from the description of specific embodiments which follows, when read in conjunction with the accompanying drawings.

DETAILED DESCRIPTION OF THE PREFERRED EMBODIMENT

Figure 1:
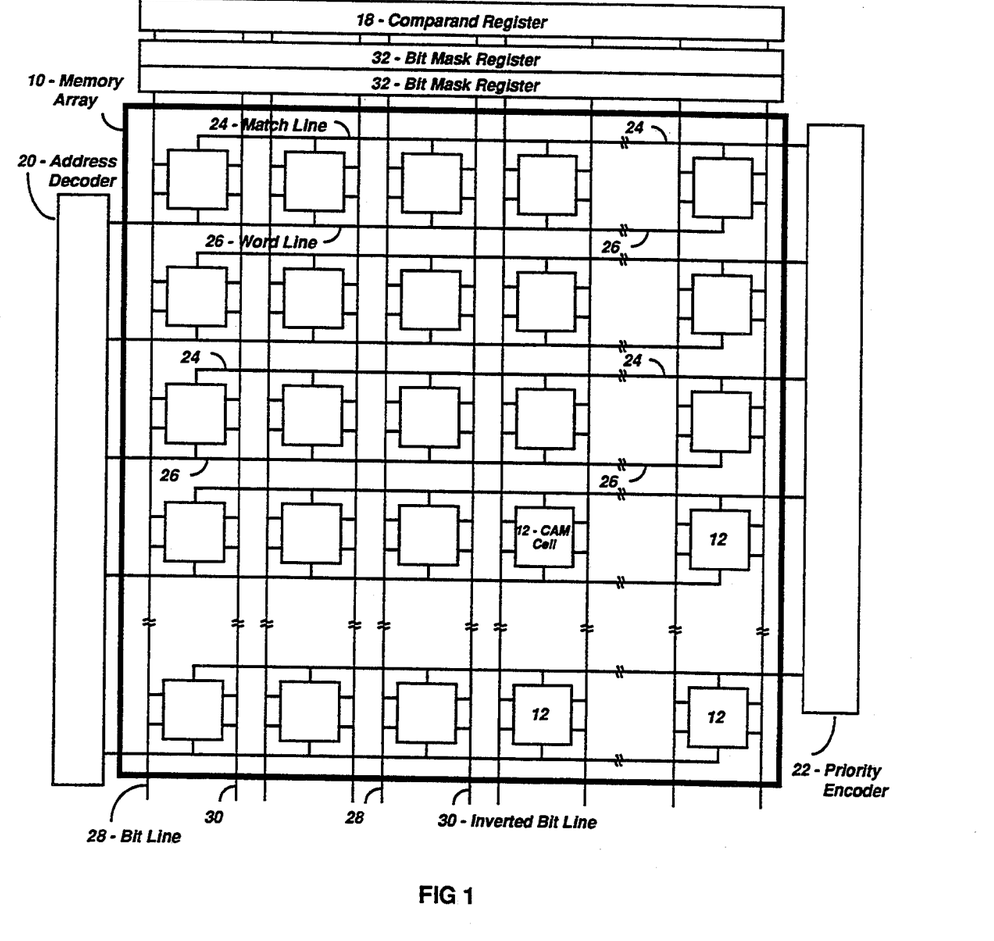
FIG. 1 is a schematic view of a memory array according to the present invention.
Figure 2:
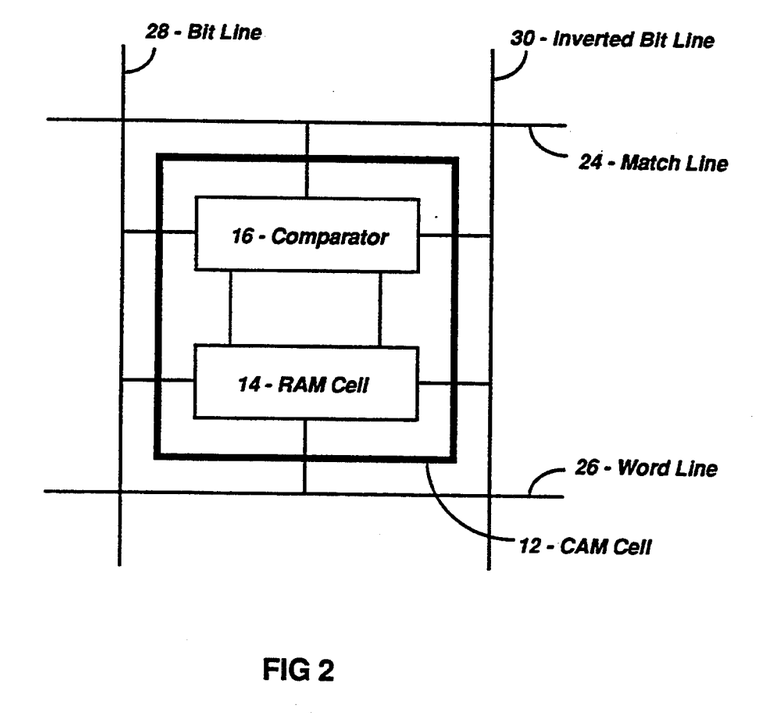
FIG. 2 is a schematic view of a memory cell contained in the memory array of the present invention.

The method of selectively programming a memory array so that some segments function as CAM and other segments function as RAM according to the present invention can be better understood by reference to FIG. 1. A memory array 10 is formed by coupling together a plurality of CAM cells 12 in rows and columns. Each row of CAM cells 12 includes a predefined number M of CAM cells 12, capable of storing a data word comprising M bits. Each column of CAM cells 12 includes a predefined number N of CAM cells 12, so that N data words may be stored in the array 10. As is shown in FIG. 2, each CAM cell 12 comprises a RAM cell 14 and a comparator 16. A search word may be storm in a comparand register 18, shown in FIG. 1, for comparison with each data word storm in the memory array 10. The comparand register 18 is connected to each CAM cell 12 in a column of the memory array 10 by a bit line 28 and an inverted bit line 30. When a comparison is accomplished, each bit in the search word is simultaneously compared to the corresponding bit in the relevant column of all data words stored in the array 10. This comparison is accomplished by the comparators 16, each of which compare the contents of the applicable bit from the comparand register 18 with the contents of the RAM cell 14 to which that comparator 16 is connected.

Figure 3:
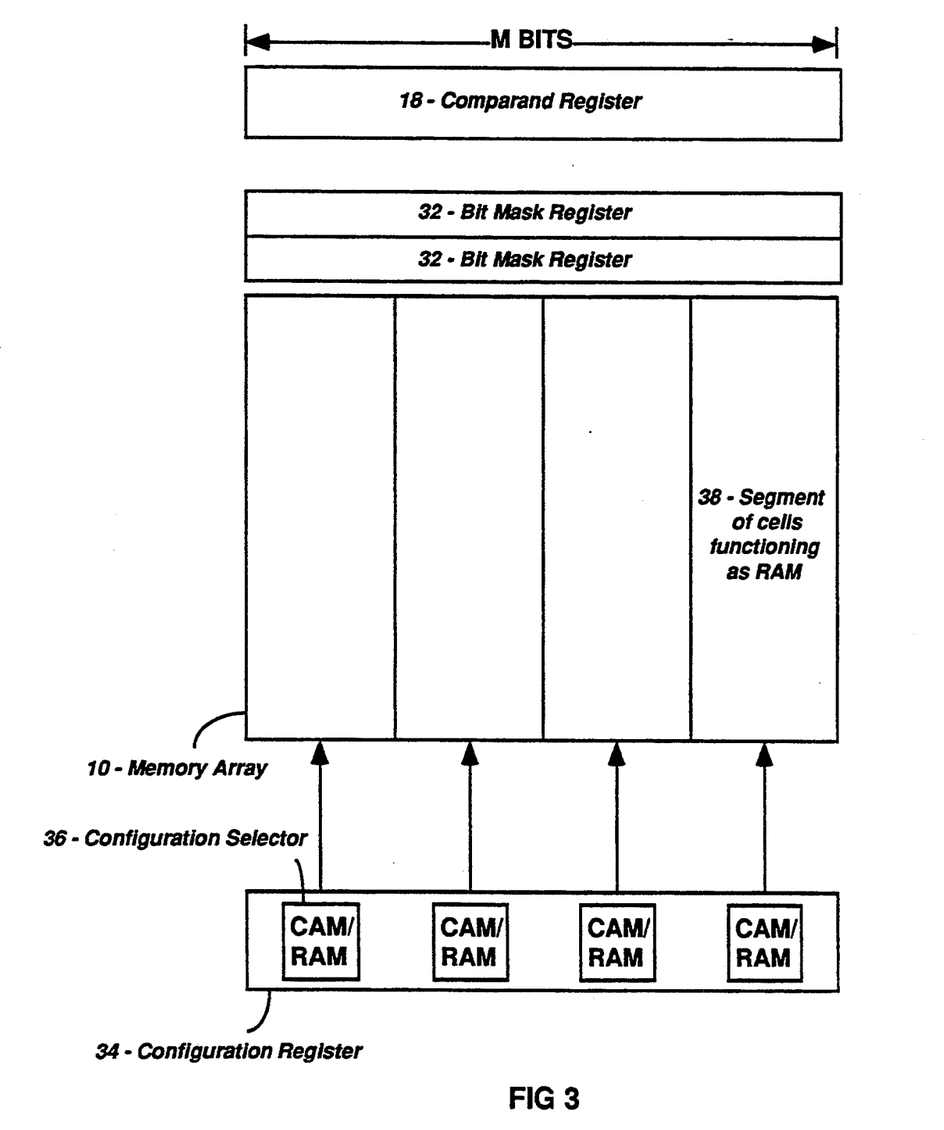
FIG. 3 is a schematic view of a memory army which has been partitioned into CAM and RAM subfields using the method of the present invention.

Each row of CAM cells 12 is connected to a priority encoder 22 by a match line 24. Similarly, each row of CAM cells 12 is connected to an address decoder 20 by a word line 26. The address decoder 20 assigns an address for each data word as it is loaded into the memory array 10. As each bit stored in each CAM cell 12 is compared with the corresponding bit in a search word, the comparator 16 of that CAM cell 12 generates a match signal indicating a match between the search word bit and the data word bit, or a no-match signal indicating a failure to match. The match signal or no-match signal is carried by means of the match line 24 to the priority encoder 22. If a no-match signal is generated for any one or more CAM cells 12 in a row, then the priority encoder 22 is not activated by that row of CAM cells 12. If a match signal is conveyed to the priority encoder 22 from any row, then the priority encoder 22 computes the address of the highest priority row, which priority is based on criteria previously programmed into the priority encoder 22. To establish a portion of the memory array 10 which will function as a RAM subfield, all of the comparators 16 in one or more columns of CAM cells 12 in memory array 10 are selected to be disabled in such a way that each RAM cell 14 in said column may store a bit of information, but each comparator 16 in said column does not participate in a comparison with the search word. Each column of CAM cells 12 which are so selected effectively function as RAM, rather than CAM, cells. Said selection is accomplished through a programmable configuration means wherein one or more columns of CAM cells 12 are disqualified from comparisons between the search word in the comparand 18 and data words stored in the memory array 10. As is shown in FIG. 3, a configuration register 34 is provided which conveniently enables a user to select which columns of CAM cells 12 will be configured to function as RAM cells. The configuration register 34 may be advantageously designed so that particular segments of the memory array 10, comprising a set of columns of CAM cells 12, may be selected by the user to function as RAM cells. For example, in one embodiment, the memory array 10 may be grouped into four segments, as shown in FIG. 3. A separate configuration selector 36 is associated with each of the four segments, so that the user can select whether the segment associated with that configuration selector 36 will function as CAM or RAM. The user may conveniently utilize this same configuration register 34 to change, after initial selection, the CAM or RAM classification of each segment. When a configuration selector 36 is used to identify a segment 38 which will function as RAM, all CAM cells 12 in that segment 38 will function as RAM cells, with all comparators 16 within that segment being disabled.

Disabling of comparators 16 of a column of CAM cells 12 may be efficiently accomplished by forcing a signal carried to that column by the bit line 28 and the corresponding inverted bit line 30 to be equal. When the bit line 28 and inverted bit line 30 are forced to the same logic state, all of the comparators 16 in the selected column or columns are disabled. In this manner, the comparator 16 for each CAM cell 12 in the column connected to that bit line 28 and inverted bit line 30 will register a match between the applicable bit in the search word and the corresponding bit in the RAM cell 14 of that CAM cell 12, and will not indicate a failure to match. As a result, a match signal cannot be prevented by any of the CAM cells in the column whose comparators 16 are disabled, from reaching, via the match lines 24, the priority encoder 22.

When the priority encoder 22 identifies a data word which matches the search word, particular information related to the search word may be directly stored in CAM cells 12 functioning as RAM cells in the row of CAM cells 12 where the matching data word is stored. Those CAM cells 12 which function as RAM cells because of a disabling of the comparator 16 in those cells shall be referred to herein as RAM-functioning cells. Advantageously, the ability to locate a given data word by means of a comparison to a search word provides access to the associated information for storage in or retrieval from said RAM-functioning cells without having to know or to compute the address or location of said associated information.

Because the CAM cells 12 that store a data word and the RAM-functioning cells that store associated information for that data word are conveniently located on the same integrated circuit, the amount of time and energy required to store associated information is considerably lessened over memory arrays in which associated information is stored in RAM cells located on a separate chip. The means for storing associated information may conveniently be bi-directional, so that associated information may also be directly retrieved from RAM-functioning cells in the row of CAM cells 12 storing a matching data word. Direct retrieval of associated information can be accomplished without computing the address identifying the location of the associated information, and without having to access RAM cells on a separate chip. As a result, both storage and retrieval of associated information is most efficiently accomplished.

Associated information can be retrieved from or stored to RAM-functioning cells, without searching the CAM cells storing the data word related to that associated information. Such independent retrieval and storage can be accomplished by changing the configuration of the memory array, so that RAM-functioning cells storing associated information are re-characterized to function as CAM cells. Those CAM cells can be directly compared with a search word to retrieve particular associated information. Alternatively, said RAM-functioning cells storing associated information may be accessed as a function of location address.

Information regarding the search word to be compared with each data word is conveyed to each column of CAM cells 12 by means of a bit line 28 and an inverted bit line 30. That information may be first routed through one or more bit mask registers 32, as shown in FIG. 1. Particular bits stored in a bit mask register 32 prevent the corresponding bits in all data words from participating in a search of the data words in the array 10. Such bit masking may be utilized without being affected by the selection of certain columns of CAM cells 12 to function as RAM cells within the memory array 10.

A write masking means may be provided, to selectively mask a portion of RAM-functioning cells. Once such a write masking scheme has been enabled, the masked portion of RAM-functioning cells will be write-protected from further storage of associated information, so that associated information will only be stored in remaining RAM-functioning cells in the row of CAM cells storing the pertinent data word. Said write masking means may also be applied to CAM cells 12 which are functioning as CAM, rather than RAM.

Example of the Preferred Embodiment

One embodiment of the claimed invention is particularly useful in network bridge and router applications. A local area network (LAN) may be divided into segments which are connected to form the complete network. The performance of each segment is considerably more efficient than the performance of the complete network if no segments are utilized. However, segmentation requires that each segment be connected to all other segments. This is typically done by a Router, which determines which of a number of possible routes through the network particular information takes, or a Bridge, which connects two or more segments and decides to which segment to send a data packet.

The Bridge must compare destination addresses for a particular data packet with all addresses available on the network. Clearly, searching all network addresses in a sequential fashion is much more time consuming than searching those network addresses in a single transaction. If the list of all network addresses is written into the memory array of the instant invention, the destination address for a particular data packet can be entered in the comparand, and a comparison accomplished. In this particular embodiment, a 64-bit field width for the memory array can be partitioned into 16 bit segments, each of which can be configured to function as CAM or RAM. An organization of 48 bits CAM and 16 bits RAM is most advantageous. The RAM-functioning bits are accessed as a function of the matching location in the CAM field. Associated information such as bridge port address, segment status, access conditions, and station aging data can be stored in the RAM-functioning bits. In this way, the bridge can decide whether and where to send the data packet based on this data.

The ability to programmably control the configuration of CAM/RAM partitioning allows subsequent searches of associated information stored in RAM-functioning cells. As a result, stored data words may be characterized as a function of the contents of said RAM-functioning cells. In the bridge and router application, this facility may be advantageously used to identify all entries that have not been accessed in a prescribed period so that old or inactive entries can be purged, freeing space for additional active entries, and reducing the required amount of CAM storage in the system.

The invention has been described in detail with particular reference to preferred embodiments thereof. As will be apparent to those skilled in the art in the light of the accompanying disclosure, many alterations, substitutions, modifications, and variations are possible in the practice of the invention without departing from the spirit and scope of the invention.

I claim:

1. A memory array comprising:
   (a.) a plurality of content addressable memory (CAM) cells coupled together to form an array of N data words of M bits each of CAM storage locations, wherein each CAM cell comprises a random access memory (RAM) cell capable of storing one bit of information connected to a comparator,
   (b.) a comparison means for comparing a search word comprising a plurality of bits, so that each bit in said search word is simultaneously compared with a corresponding bit in all data words stored in said plurality of CAM cells, by means of said comparator in each said CAM cell,
   (c.) comparison result generating means for generating a match signal, said match signal assuming a match state for each data word which is determined to match said search word when said search word is compared with said data words by said comparison means, and said match signal assuming a no-match state for each data word which is determined not to match said search word when said search word is compared with said data words by said comparison means,
   (d.) comparator disabling means for disabling each comparator in at least one selected column of CAM cells, resulting in each CAM cell in each such selected column of CAM cells not participating in any comparison with said search word, so that all CAM cells in each such selected column function solely as RAM cells storing associated information, while all CAM cells which are not in such a selected column are participating in comparisons, and
   (e.) retrieval and storage means for directly retrieving and storing associated information stored in those CAM cells which are functioning solely as RAM cells, without computing and without decoding an address for said associated information.

2. The memory array as described in claim 1, further comprising:
   (f.) configuration means to select each column of CAM cells in which comparators will be disabled by said comparator disabling means so that each such column will not participate in any comparison with said search word.

3. The memory array as described in claim 1, wherein said associated information is available for retrieval from and storage to said CAM cells which are functioning solely as RAM cells, without using said comparison means to compare a search word with a plurality of bits stored in said CAM cells whose comparators are not disabled by said comparator disabling means.

4. The memory array as described in claim 1, wherein all CAM cells, including those CAM cells functioning solely as RAM cells and including those CAM cells which are not functioning as RAM cells, are located on a single integrated circuit.

5. The memory array as described in claim 1, further comprising a bit masking means by which particular sequences of bits in said data words corresponding to said bit masking means will not participate in a comparison between said search word and said data words, wherein said comparator disabling means does not interfere with said bit masking means.

6. The memory array as described in claim 1, further comprising a write masking means for masking a selected portion of CAM cells, preventing contents of said selected portion of CAM cells from being modified during storing operations.

7. The memory array as described in claim 1, further comprising a priority encoder means by which a data word is selected from all data words for which a match signal was generated said priority encoder means having received at least one match signal from at least one data word in said CAM cell array.

8. The memory array as described in claim 7,
   wherein said comparison result generating means further comprises a match line connected to each CAM cell storing a single data word and connected to said priority encoder means, which match line is capable of sending to said priority encoder means a match signal indicating a match and a no-match signal indicating a failure to match generated by each comparator in each CAM cell storing said data word, and
   wherein said comparator disabling means further comprises forcing a match signal to be sent to said match line from a CAM cell in said selected column of CAM cells.

9. The memory array as described in claim 8,
   wherein said comparison means further comprises a bit line and an inverted bit line, each of which is connected to each comparator in all CAM cells in said selected column, and wherein said comparator disabling means further comprises forcing a signal sent by said bit line and said inverted bit line to be equal, so that a match signal will to be sent to said match line from a CAM cell in said selected column of CAM cells connected to said bit line and said inverted bit line.

10. A method of programming a memory array containing a plurality of content addressable memory (CAM) cells coupled together to form an array of N data words of M bits each of CAM storage locations, wherein each CAM cell comprises a random access memory (RAM) cell capable of storing one bit of information connected to a comparator, said method comprising the steps of:

(a.) selecting at least one column of CAM cell in which comparators will be disabled so that each such column will not participate in any comparison with a search word, (b.) disabling each comparator in each such column of CAM cells, resulting in each CAM cell in each such column of CAM cells not participating in any comparison with said search word, so that all CAM cells in each such selected column function solely as RAM cells storing associated information, and (c.) directly retrieving and storing associated information stored in those CAM cells which are functioning solely as RAM cells, without computing and without decoding an address for said associated information.

* * * * *

UNITED STATES PATENT AND TRADEMARK OFFICE
CERTIFICATE OF CORRECTION

PATENT NO. : 5,383,146
DATED : January 17, 1995
INVENTOR(S) : Norman B. Threewitt Page 1 of 2

It is certified that error appears in the above-identified patent and that said Letters Patent is hereby corrected as shown below:

Col. 7, line 49 (Claim 1)
    After "to" insert --one of--.
    Delete "comparator" and insert --plurality of comparators--.

Col. 7, lines 54-55 (Claim 1)
    Delete "comparator" and insert --comparators--.

Col. 7, line 55 (Claim 1)
    Delete "each"
    Delete "cell" and insert --cells--.

Col. 8, line 11 (Claim 1)
    Delete "without computing and"

Col. 9, line 7, delete beginning with "10. A method of programming" to and including "information." in col. 10, line 15, and insert the following claim:

10. A method of programming a memory array containing a plurality of content addressable memory (CAM) cells coupled together to form an array of N data words of M bits each of CAM storage locations, wherein each CAM cell comprises a random access memory (RAM) cell capable of storing one bit of information connected to one of a plurality of comparators, said method comprising the steps of:

UNITED STATES PATENT AND TRADEMARK OFFICE
CERTIFICATE OF CORRECTION

PATENT NO. : 5,383,146
DATED : January 17, 1995
INVENTOR(S) : Norman B. Threewitt It is certified that error appears in the above-identified patent and that said Letters Patent is hereby corrected as shown below:

(a.)    comparing a search word comprising a plurality of bits, so that each bit in said search word is simultaneously compared with a corresponding bit in all data words stored in said plurality of CAM cells, by means of said comparators in said CAM cells,     (b.)    generating a match signal, said match signal assuming a match state for each data word which is determined to match said search word when said search word is compared with said data words, and said match signal assuming a no-match state for each data word which is determined not to match said search word when said search word is compared with said data words,     (c.)    disabling each comparator in at least one selected column of CAM cells, resulting in each CAM cell in each such selected column of CAM cells not participating in any comparison with said search word, so that all CAM cells in each such selected column function solely as RAM cells storing associated information, while all CAM cells which are not in such a selected column are participating in comparisons, and     (d.)    directly retrieving and storing associated information stored in those CAM cells which are functioning solely as RAM cells, without decoding an address for said associated information.

Signed and Sealed this

Eighth Day of September, 1998

Attest:

BRUCE LEHMAN

Attesting Officer      Commissioner of Patents and Trademarks